US008759689B2

(12) United States Patent
Chan et al.

(10) Patent No.: US 8,759,689 B2
(45) Date of Patent: Jun. 24, 2014

(54) LAND PATTERN FOR 0201 COMPONENTS ON A 0.8 MM PITCH ARRAY

(75) Inventors: Alex Chan, Nepean (CA); Paul James Brown, Wakefield (CA)

(73) Assignee: Alcatel Lucent, Paris (FR)

( * ) Notice: Subject to any disclaimer, the term of this patent is extended or adjusted under 35 U.S.C. 154(b) by 686 days.

(21) Appl. No.: 12/984,240

(22) Filed: Jan. 4, 2011

(65) Prior Publication Data

US 2012/0168216 A1   Jul. 5, 2012

(51) Int. Cl.
*H05K 1/16* (2006.01)
*H01G 4/228* (2006.01)
*G06F 17/50* (2006.01)

(52) U.S. Cl.
USPC ........................................................ 174/260

(58) Field of Classification Search
USPC ..................... 361/306.2; 174/260; 716/55
See application file for complete search history.

(56) References Cited

U.S. PATENT DOCUMENTS

| | | | | |
|---|---|---|---|---|
| 6,121,554 | A * | 9/2000 | Kamikawa | 174/260 |
| 6,169,253 | B1 * | 1/2001 | Jairazbhoy et al. | 174/250 |
| 6,509,530 | B2 * | 1/2003 | Pearson et al. | 174/260 |
| 6,710,255 | B2 * | 3/2004 | Ross et al. | 174/255 |
| 6,736,308 | B1 * | 5/2004 | Downes | 228/248.1 |
| 6,833,615 | B2 * | 12/2004 | Geng et al. | 257/698 |
| 6,834,427 | B2 * | 12/2004 | Cornelius et al. | 29/840 |
| 6,992,374 | B1 * | 1/2006 | Yang et al. | 257/678 |
| 7,036,217 | B2 * | 5/2006 | Pearson et al. | 29/840 |
| 7,153,723 | B1 * | 12/2006 | Medeiros | 438/106 |
| 7,208,348 | B2 * | 4/2007 | Geng et al. | 438/125 |
| 7,292,450 | B2 * | 11/2007 | Larsen et al. | 361/763 |
| 7,312,402 | B2 * | 12/2007 | Antu et al. | 174/260 |
| 7,323,787 | B2 * | 1/2008 | Chan | 257/780 |
| 7,360,307 | B2 * | 4/2008 | Yang et al. | 29/840 |
| 7,412,923 | B2 * | 8/2008 | Shaeffer et al. | 101/127 |
| 7,602,615 | B2 * | 10/2009 | Chan et al. | 361/767 |
| 7,954,081 | B2 * | 5/2011 | Bartley et al. | 716/137 |
| 8,288,870 | B2 * | 10/2012 | Hsieh | 257/773 |
| 8,405,231 | B2 * | 3/2013 | Hayashi | 257/786 |
| 2003/0047348 | A1 * | 3/2003 | Jessep et al. | 174/250 |
| 2003/0089522 | A1 * | 5/2003 | Dances | 174/260 |
| 2005/0093153 | A1 * | 5/2005 | Liu | 257/738 |

(Continued)

OTHER PUBLICATIONS

Method to Modify 0201 Padstack to Allow Components under 0.8mm Pitch BGA, IP.Com Technical Disclosure, Electronically Published Jul. 22, 2011.*

*Primary Examiner* — Jeremy C Norris
*Assistant Examiner* — Nathan Milakovich
(74) *Attorney, Agent, or Firm* — Kramer Amado P.C.

(57) ABSTRACT

A land pattern for 1 mm and 0.8 mm pitch arrays has been disclosed for placing two port devices. The land pattern includes a ball grid array (BGA) of BGA pads each connected to a respective through hole via, and a pair of rectangular conductive pads electrically connected to a an adjacent pair of through hole vias, wherein each rectangular pad extends out from its via towards the other via of the pair along a line connecting the centers of said adjacent pair vias. A solder mask is located on the rectangular pad side and has apertures over each rectangular conductive pad. The land pattern is particularly useful for locating two port devices directly underneath a BGA device while minimizing the distance from a BGA ball to the two port device lead.

10 Claims, 4 Drawing Sheets

(56) References Cited

U.S. PATENT DOCUMENTS

2005/0162839 A1* 7/2005 Chan et al. .................... 361/782
2007/0294653 A1* 12/2007 Bartley et al. .................. 716/11
2009/0309210 A1* 12/2009 Danno ......................... 257/690
2011/0121293 A1* 5/2011 Chen ............................... 257/48
2011/0121841 A1* 5/2011 Chen ............................. 324/658
2013/0062762 A1* 3/2013 Chan et al. .................... 257/738
2013/0062763 A1* 3/2013 Chan et al. .................... 257/738
2013/0100624 A1* 4/2013 Carpenter et al. ............ 361/783

* cited by examiner

LAND PATTERN FOR 0201 COMPONENTS ON A 0.8 MM PITCH ARRAY

FIELD OF THE INVENTION

The invention is directed to placement of two-port surface mount components relative to Ball Grid Arrays (BGAs) and in has particular use in placement of decoupling capacitors for grid array components.

BACKGROUND OF THE INVENTION

This invention relates to the design of electronic circuit cards. Specifically, it may be directed to the problem of electrically decoupling a BGA device with 0201 size surface mount capacitors placed on the opposite side of the circuit card with respect to the BGA device and within the grid of vias and contacts used to route signal traces to and from the BGA device.

A number of solutions have been previously developed. These solutions targeted at solving decoupling issues on 1.00 mm pitch BGA devices. However these solutions are not applicable to finer pitch BGA devices (<1.00 mm). Increasing design densities and component miniaturization trends are making the use of 0.80 mm pitch BGAs more common on many designs.

One prior art approach uses octagonal land patterns in combination with specifically filled vias underneath fine pitch BGA devices for decoupling applications using 0402 sized capacitors. This approach was disclosed in U.S. Pat. No. 7,602,615 by the assignee hereof and is incorporated herein by reference.

A drawback of this approach is the land placements limits application of 0402 decoupling capacitors to between adjacent BGA pins on a grid having a 1.00 mm pitch in at least one grid direction.

Therefore, it would be desirable to overcome this limitation so as to increase be able to place decoupling capacitors on a BGA grid pattern having sub-1.00 mm dimensions in both grid directions, thereby enabling more termination and decoupling opportunities.

SUMMARY OF THE INVENTION

It is an object of the invention to provide a land pattern for placement of two port surface mount components relative to BGAs.

According to an aspect of the invention there is provided an electronic circuit board (ECB) having a ball grid array (BGA) of BGA pads on a first side of the ECB, arranged in a grid pattern of rows and columns; through hole vias having conductive barrels extending from the first side of the ECB to an opposite second side of the ECB, and wherein each of the through hole vias is offset from a corresponding one of the BGA pads and electrically connected to the corresponding BGA pad by a conductor on the first side; and wherein at least one adjacent pair of the though hole vias having a via pad around the through hole via and electrically connected to the conductive barrel of the through hole via on the second side; each via pad of the adjacent pair extending out from its respective corresponding one of the adjacent pair of through hole vias towards the other via of the adjacent pair of through hole vias along a line connecting the centers of the adjacent pair of through hole vias; a solder mask located on the second side; the solder mask having apertures above and over each via pad of the adjacent pair; and a 0201 size two-port device mounted in electrical connection directly on the via pads through the apertures in a given alignment with the grid pattern.

In some embodiments of the invention the pair of via pads is arranged in a direction aligned to the grid pattern of the BGA pads. In other embodiments the pair of via pads is arranged in a direction having diagonal alignment with the grid pattern of the BGA pads.

In some embodiments of the invention the two port device is a linear device. The linear device may be a resistor, inductor or capacitor. Advantageously, in some embodiments the linear device is a decoupling capacitor.

In some embodiments of the invention the two port device is a non-linear device. The non-linear device may be a diac, a zener diode, and a memristor. Advantageously, in some embodiments the non-linear device is a surge suppressor capacitor.

According to another aspect of the invention there is provided a computer aided design tool for accommodating a two-port device in an 0.8 mm by 0.8 mm pitch ball grid array (BGA) electronic circuit board (ECB) having a design tool mode to identify, in an ECB configuration of BGA pads in a grid pattern on a first side of the ECB and through hole vias adjacent to the BGA pads, each of the through holes vias connected to a corresponding BGA pad by a corresponding trace on the first side of the ECB, at least one adjacent pair of the though hole vias having a via pad around the through hole via and electrically connected to the conductive barrel of the through hole via on the second side; the via pad pair for directly mounting of and connection to a corresponding one of the two port devices; a first design tool mode to configure the via pad pairs to have a configuration that configures each pair of via pads to extend out from its respective corresponding one of the adjacent pair of through hole vias towards the other via of the adjacent pair of through hole vias along a line connecting the centers of the adjacent pair of through hole vias; a second design tool mode to configure a solder mask located on the second side to have apertures above and over each via pad.

Note: in the following the description and drawings that follow merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

BRIEF DESCRIPTION OF THE DRAWINGS

The foregoing and other objects, features and advantages of the invention will be apparent from the following more particular description of the preferred embodiments, as illustrated in the appended drawings, where.

The use of similar or identical reference numbers in the various drawings is intended to indicate the presence of a similar or identical element or feature.

DETAILED DESCRIPTION

Figure 1:
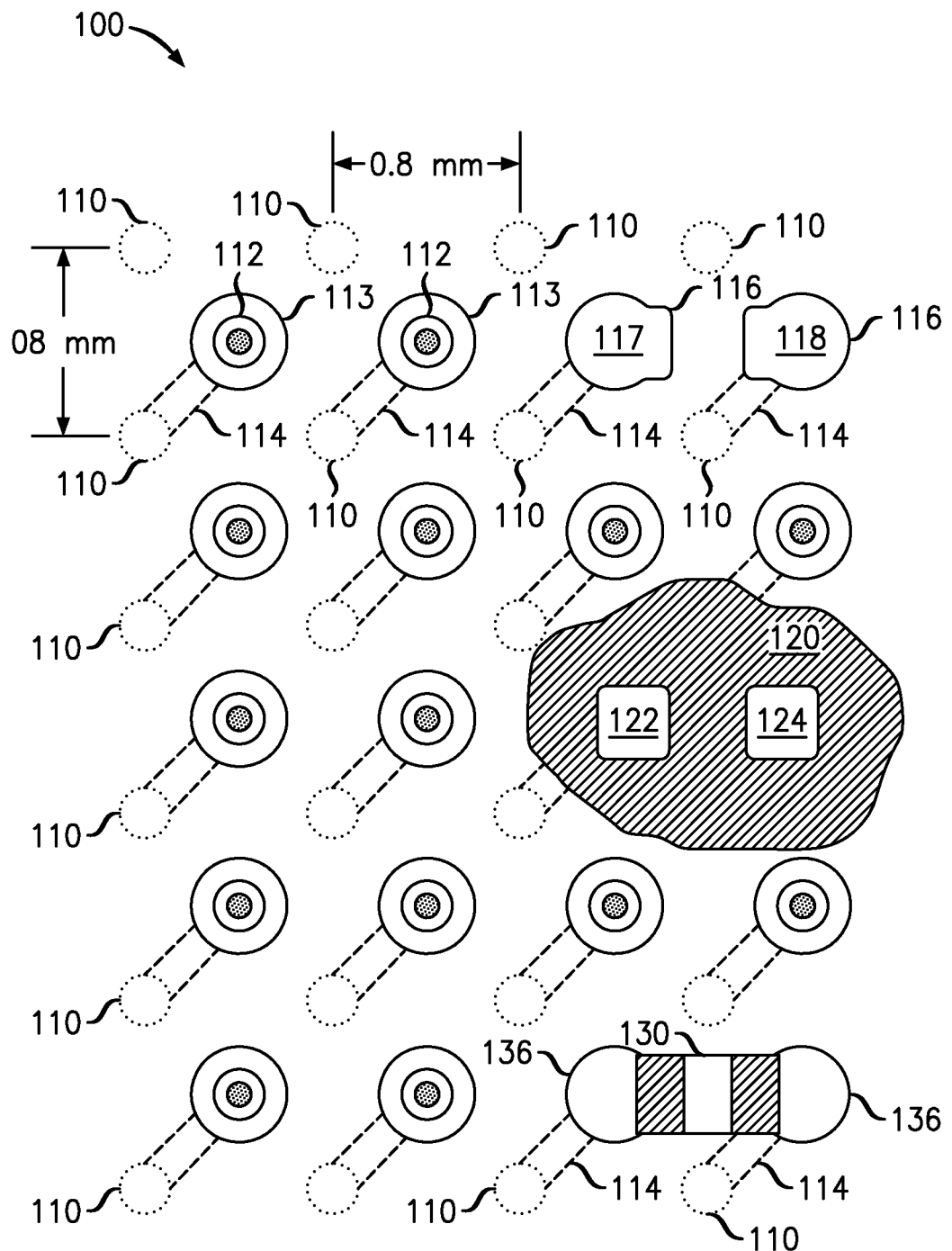
FIG. 1 illustrates a first embodiment of the invention.

Referring to FIG. 1, there may be seen a section of an electronic circuit board 100 which has an array of BGA pads 110. The BGA pads 110 are on the side of the circuit board opposite to which the two port device would be placed, and in this embodiment are distributed on a 0.8 mm grid. Also visible are a grid of through hole vias 112 which are each connected to a respective BGA pad 110 by a trace 114. The through hole vias 112 have via pads 113 which surround the barrel of the via on the non-BGA side of the electronic circuit board. The through hole vias 112 go through electronic circuit board 100 with the hole inside the conductive barrel of the via generally being filled with conductive or non-conductive material.

In FIG. 1, some of the via pads have been extended so as to provide a land for a two port component. As may be seen by via pad pair 116 having left hand pad 117 and right hand pad 118, the generally circular pads 113 have been extended by a generally rectangular extension which extends along a line connecting the centers of the paired vias towards the respective opposite via pad of the pair.

Also apparent in FIG. 1 is a section of solder resist layer 120. This solder resist is applied to the surface of electronic circuit board 100 to delimit areas wherein solder may adhere to the board. For ease of understanding, only a portion of solder resist is shown so that the circuit board features elsewhere in FIG. 1 are not obscured. Visible in solder resist layer section 120 are apertures 122 and 124. Each aperture corresponds with a respective portion of the via pad pair underlying the solder mask which serves as a land for a respective end of a two port component.

A 0201 size two port component 130 may be seen in position on via pad pair 136. The solder resist layer has not been included in this section so that the portion of via pad pair 136 not covered by two port component 130 remains visible.

FIG. 1 thus depicts the placement of a 0201 sized component according to a horizontal direction of the BGA grid.

Figure 2:
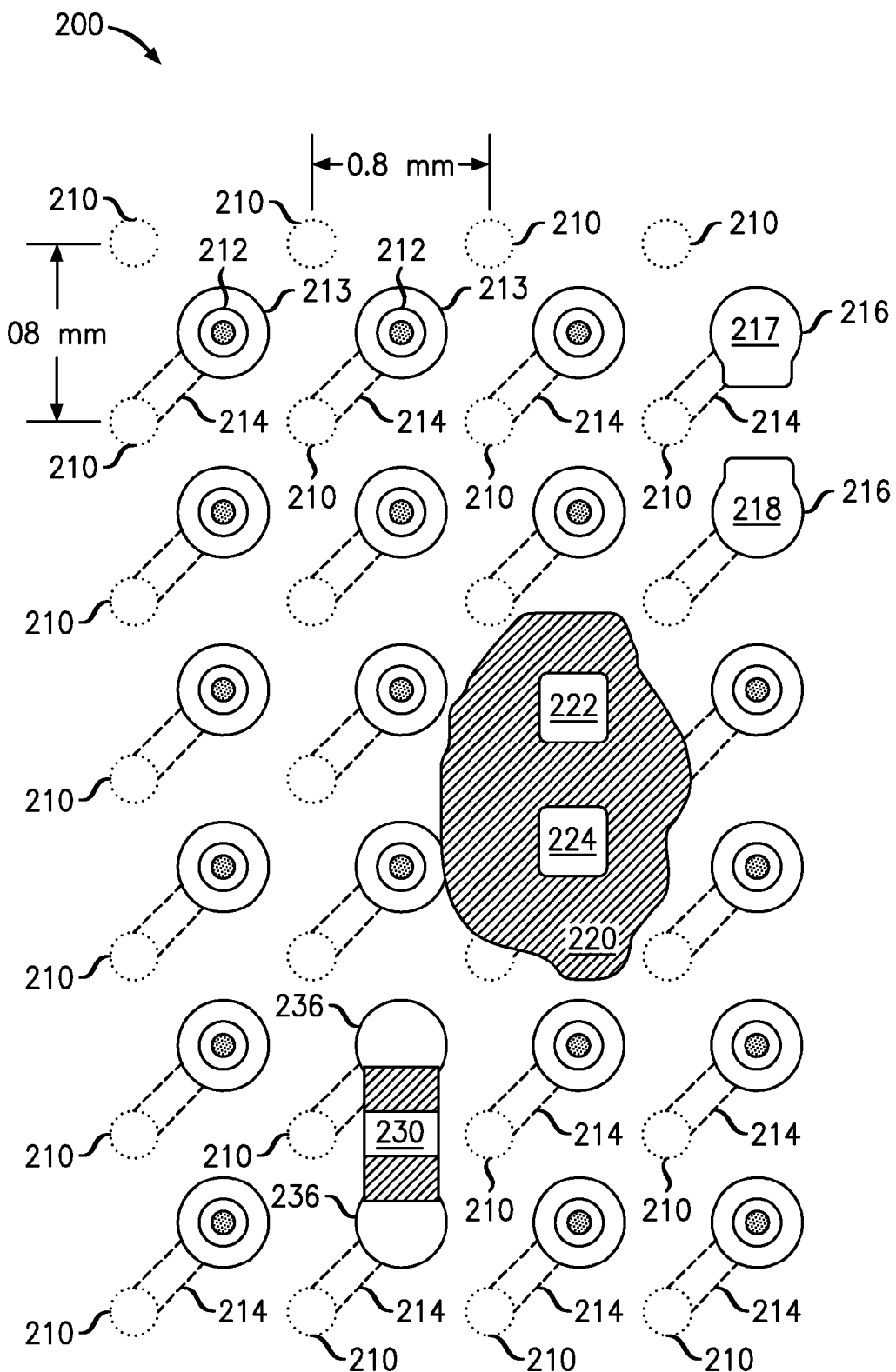
FIG. 2 illustrates a second embodiment of the invention.

Referring now to FIG. 2, there may be seen an embodiment of the invention wherein a 0201 sized component is placed according to a vertical direction of the BGA grid. There may be seen a section of an electronic circuit board 200 which has an array of BGA pads 210. The BGA pads 210 are on the side of the circuit board opposite to which the two port device would be placed, and in this embodiment are distributed on a 0.8 mm grid. Also visible are a grid of through hole vias 212 which are each connected to a respective BGA pad 210 by a trace 214. The through hole vias 212 have via pads 213 which surround the barrel of the via on the non-BGA side of the electronic circuit board. The through hole vias 212 go through electronic circuit board 200 with the hole inside the conductive barrel of the via generally being filled with conductive or non-conductive material.

In FIG. 2, some of the via pads have been extended so as to provide a land for a two port component. As may be seen by via pad pair 216 having upper pad 217 and lower pad 218, the generally circular pads 213 have been extended by a generally rectangular extension which extends along a line connecting the centers of the paired vias towards the respective opposite via pad of the pair.

Also apparent in FIG. 2 is a section of solder resist layer 220. This solder resist is applied to the surface of electronic circuit board 200 to delimit areas wherein solder may adhere to the board. For ease of understanding, only a portion of solder resist is shown so that the circuit board features elsewhere in FIG. 2 are not obscured. Visible in solder resist layer section 220 are apertures 222 and 224. Each aperture corresponds with a respective portion of the via pad pair underlying the solder mask 220 which serves as a land for a respective end of a two port component.

A 0201 size two port component 230 may be seen in position on via pad pair 236. The solder resist layer has not been included in this section so that the portion of via pad pair 236 not covered by two port component 230 remains visible.

FIG. 2 thus depicts the placement of a 0201 sized component according to a vertical direction of the BGA grid.

Figure 3:
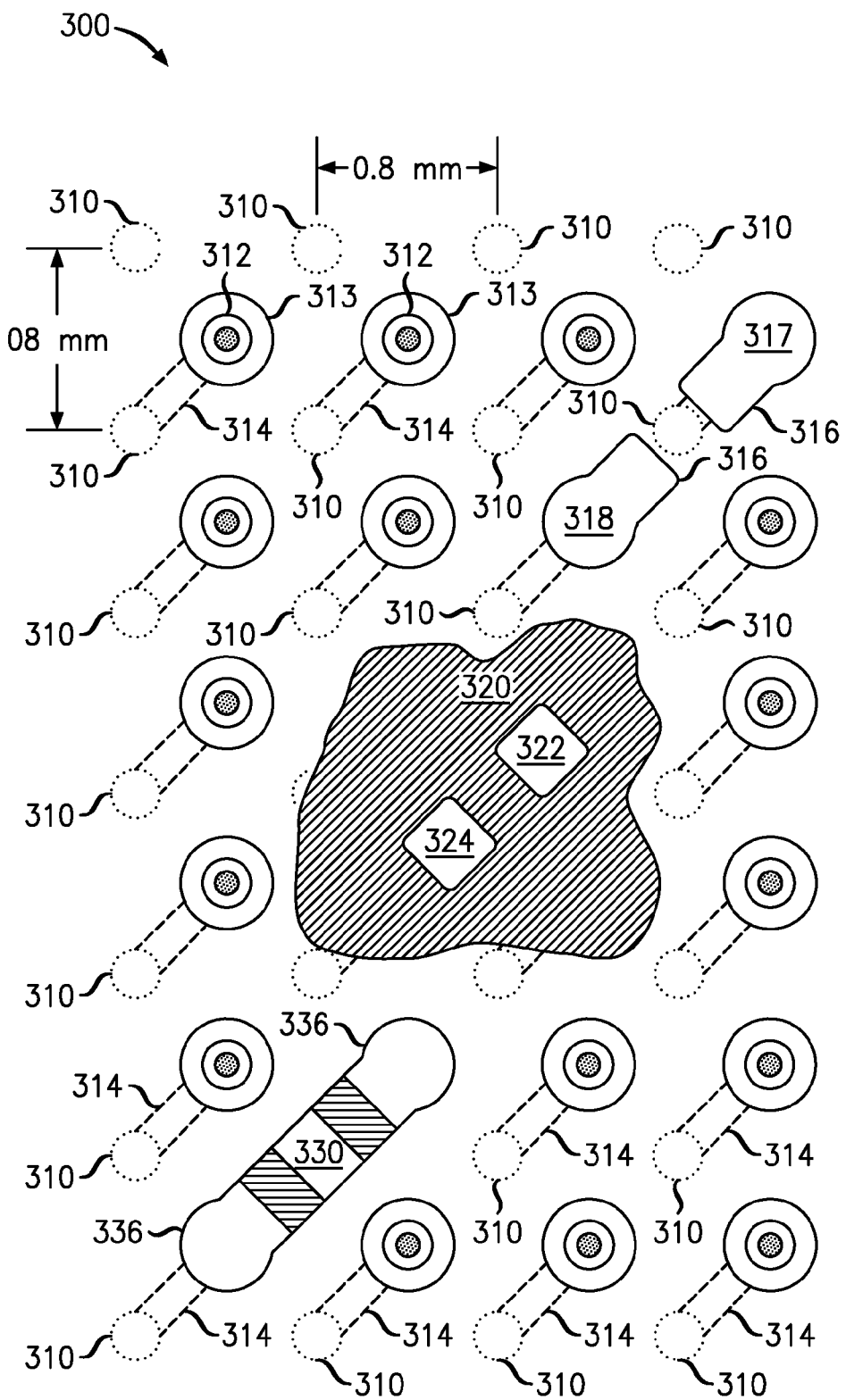
FIG. 3 illustrates a third embodiment of the invention.

Now referring now to FIG. 3, there may be seen an embodiment of the invention wherein a 0201 sized component is placed according to a diagonal direction relative to the BGA grid. There may be seen a section of an electronic circuit board 300 which has an array of BGA pads 310. The BGA pads 310 are on the side of the circuit board opposite to which the two port device would be placed, and in this embodiment are distributed on a 0.8 mm grid. Also visible are a grid of through hole vias 312 which are each connected to a respective BGA pad 310 by a trace 314. The through hole vias 312 have via pads 313 which surround the barrel of the via on the non-BGA side of the electronic circuit board. The through hole vias 312 go through electronic circuit board 300 with the hole inside the conductive barrel of the via generally being filled with conductive or non-conductive material.

In FIG. 3, some of the via pads have been extended so as to provide a land for a two port component. As may be seen by via pad pair 316 having upper-right pad 317 and lower-left pad 318, the generally circular pads 313 have been extended by a generally rectangular extension which extends along a line connecting the centers of the paired vias towards the respective opposite via pad of the pair.

Also apparent in FIG. 3 is a section of solder resist layer 320. This solder resist is applied to the surface of electronic circuit board 300 to delimit areas wherein solder may adhere to the board. For ease of understanding, only a portion of solder resist is shown so that the circuit board features elsewhere in FIG. 3 are not obscured. Visible in solder resist layer section 320 are apertures 322 and 324. Each aperture corresponds with a respective portion of the via pad pair underlying the solder mask 320 which serves as a land for a respective end of a two port component.

A 0201 size two port component 330 may be seen in position on via pad pair 336. The solder resist layer has not been included in this section so that the portion of via pad pair 336 not covered by two port component 330 remains visible.

FIG. 3 thus depicts the placement of a 0201 sized component according to a diagonal direction relative to the BGA grid.

Figure 4:
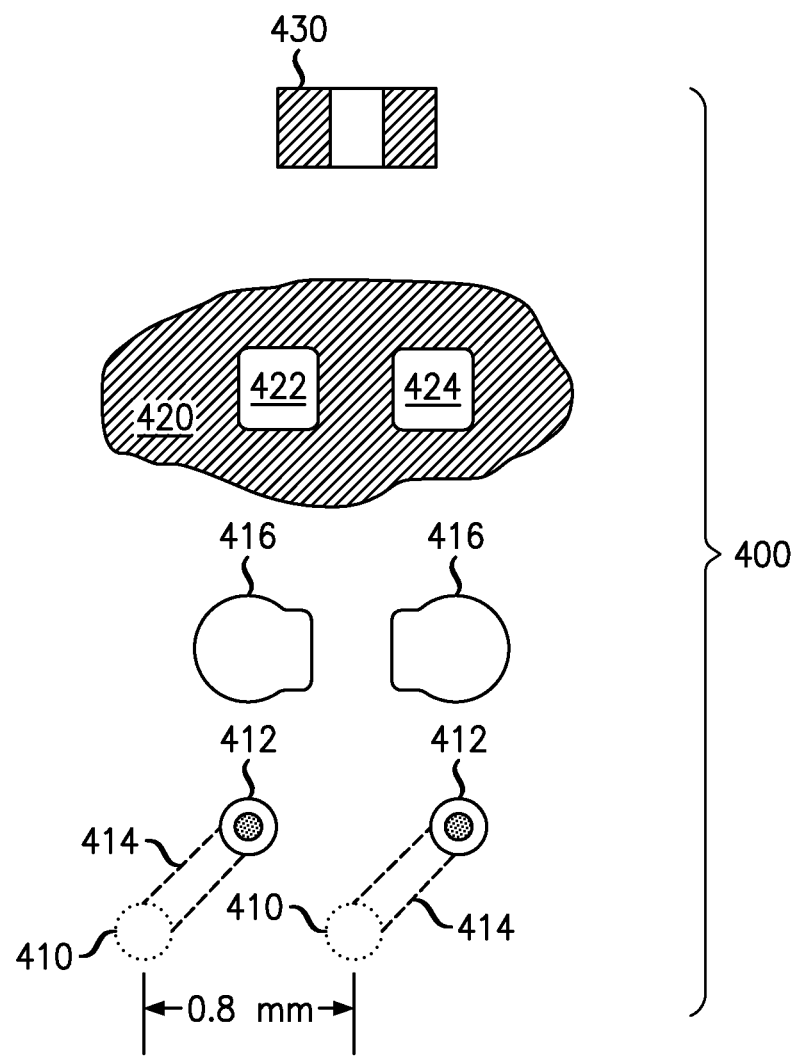
FIG. 4 illustrates an exploded diagram of a through hole via pad pair connected to BGA lands, a pair of component lands, a solder mask, and a 0201 component according to an embodiment of the invention.

Referring to FIG. 4, there may be seen an exploded diagram 400 of a pair of 0.8 mm separation BGA pads 410 connected by respective links 414 to respective through hole vias 412. Extended via pad pair 416 is positioned atop and electrically connected to through hole vias 412. Left hand extended via pad 417 has a generally rectangular protrusion extending along its line of symmetry towards right hand extended via pad 418. Likewise, right hand extended via pad 418 has a generally rectangular protrusion extending along its line of symmetry towards left hand extended via pad 417.

Surmounting the same side of the board as extended via pad pair 416 is solder mask 420 having apertures 422 and 424. Apertures 422 and 424 are positioned atop extended via pad pair 416 to define a pair of lands for attachment of a two port device. Aperture 422 defines an electrical connection land on left hand extended via pad 417, and aperture 424 defines an electrical connection land on right hand extended via pad 418. Two port device 430 is positioned atop the lands defined by the apertures on extended via pad pair 416 and electrically connected.

The aforesaid embodiments assist with densification of electric wiring board design by placing the decoupling and termination devices directly beneath the BGA device. Such a placement helps in enhancing the electrical performance of the decoupling and termination devices by minimizing the distance from the BGA device ball to the lead of the two port device.

While the embodiments have generally been described in conjunction with decoupling capacitors, further functionality would include the use of alternate two port devices. Such devices may include linear devices such as resistors or inductors, useful for termination and waveform shaping purposes. Alternatively, such devices may include non-linear devices such as zener diodes, diacs, or varistors; useful for signal clamping and device protection purposes. Other two port devices, such as memristors or light emitting diodes are also contemplated for some applications.

Numerous modifications, variations and adaptations may be made to the embodiment of the invention described above without departing from the scope of the invention, which is defined in the claims.

What is claimed is:

1. An electronic circuit board (ECB) comprising:
   a ball grid array (BGA) of BGA pads on a first side of the ECB, arranged in a grid pattern of rows and column;
   through hole vias having conductive barrels extending from said first side of the ECB to an opposite second side of the ECB,
   and wherein each of said through hole vias is offset from a corresponding one of said BGA pads and electrically connected to said corresponding BGA pad by a conductor on said first side;
   and wherein at least one adjacent pair of said though hole vias has a via pad, having a via pad body around said through hole via and electrically connected to the conductive barrel of said through hole via on said second side;
   each via pad of said adjacent pair, having a via pad portion extending out from its respective corresponding one of said adjacent pair of through hole vias towards the other via of said adjacent pair of through hole vias along a line connecting the centers of said adjacent pair of through hole via,
   wherein said via pad portion is narrower than the via pad body;
   a solder mask located on said second side;
   said solder mask having apertures above and over each via pad of said adjacent pair; and
   a 0201 size two-port device mounted in electrical connection directly on said via pads through said apertures in a given alignment with the grid pattern.

2. The electronic circuit board of claim 1, wherein said pair of via pads are arranged in a direction aligned to the grid pattern of the BGA pads.

3. The electronic circuit board of claim 1, wherein said pair of via pads are arranged in a direction having diagonal alignment with the grid pattern of the BGA pads.

4. The electronic circuit board of claim 1, wherein said two-port device is a linear device.

5. The electronic circuit board of claim 4, wherein said two-port device is one of the group consisting of a capacitor, a resistor and an inductor.

6. The electronic circuit board of claim 1, wherein said two-port device is a non-linear device.

7. The electronic circuit board of claim 6, wherein said two-port device is one of the group consisting of a diac, a zener diode, and a memristor.

8. A computer aided design tool using a computer, having a processor, for accommodating a two-port device in a ball grid array (BGA) electronic circuit board (ECB) comprising:
   a design tool mode to identify, using the processor, in an ECB configuration of BGA pads in a grid pattern on a first side of the ECB and through hole vias adjacent to the BGA pads, each of the through holes vias connected to a corresponding BGA pad by a corresponding trace on said first side of the ECB,
   at least one adjacent pair of said though hole vias having a via pad having a via pad body around said through hole via and electrically connected to the conductive barrel of said through hole via on said second side;
   said via pad pair for directly mounting of and connection to a corresponding one of said two-port devices;
   a first design tool mode, using the processor, to configure said via pad pairs to have a configuration that configures each pair of via pads to have a via pad portion to extend out from its respective corresponding one of said adjacent pair of through hole vias towards the other via of said adjacent pair of through hole vias along a line connecting the centers of said adjacent pair of through hole vias,
   wherein said portion is narrower than the via pad body;
   a second design tool mode, using the processor, to configure a solder mask located on said second side to have apertures above and over each via pad.

9. The electronic circuit board of claim 1, wherein the grid pattern is 0.8 mm by 0.8 mm.

10. The computer aided design tool of claim 8, where the grid pattern is 0.8 mm by 0.8 mm.

* * * * *